(12) United States Patent
Goergen et al.

(10) Patent No.: US 9,003,652 B2
(45) Date of Patent: Apr. 14, 2015

(54) METHOD OF FABRICATING A CIRCUIT BOARD

(75) Inventors: Joel R. Goergen, Maple Grove, MN (US); Greg Hunt, San Jose, CA (US); Peter Tomaszewski, San Jose, TX (US); Joseph Pankow, Sunnyvale, CA (US); Michael Laudon, San Jose, CA (US)

(73) Assignee: Dell Products L.P., Round Rock, TX (US)

( * ) Notice: Subject to any disclaimer, the term of this patent is extended or adjusted under 35 U.S.C. 154(b) by 520 days.

(21) Appl. No.: 13/400,207

(22) Filed: Feb. 20, 2012

(65) Prior Publication Data

US 2012/0144665 A1    Jun. 14, 2012

Related U.S. Application Data

(63) Continuation of application No. 12/001,941, filed on Dec. 13, 2007, now Pat. No. 8,119,921.

(51) Int. Cl.
*H05K 3/02* (2006.01)
*H05K 1/11* (2006.01)
*H05K 1/02* (2006.01)

(52) U.S. Cl.
CPC .............. *H05K 1/111* (2013.01); *H05K 1/0245* (2013.01); *H05K 2201/0187* (2013.01); *H05K 2201/0969* (2013.01)

(58) Field of Classification Search
USPC ............................................ 29/825, 846, 852
See application file for complete search history.

(56) References Cited

U.S. PATENT DOCUMENTS

| | | | | |
|---|---|---|---|---|
| 4,720,915 A * | 1/1988 | Kennedy et al. | ................. | 29/847 |
| 6,112,407 A * | 9/2000 | Hagner | ........................... | 29/846 |
| 6,192,580 B1 * | 2/2001 | Hayami | ......................... | 29/846 |
| 6,710,258 B2 | 3/2004 | Oggioni et al. | | |
| 7,000,314 B2 * | 2/2006 | Morris | ............................ | 29/860 |
| 7,348,498 B2 | 3/2008 | Barr et al. | | |
| 7,897,880 B1 | 3/2011 | Goergen et al. | | |

* cited by examiner

*Primary Examiner* — Carl Arbes
(74) *Attorney, Agent, or Firm* — Haynes and Boone, LLP

(57) ABSTRACT

The characteristic impedance of a surface pad is manipulated by reticulating the pad and filling the spaces with a dielectric material, providing an inductive element in the coupling of the surface pad to an underlying ground pad of a ground plane, or a combination of these approaches. In appropriate embodiments, acceptable signal trace routing paths will exist in an embedded signal layer under the ground plane and crossing under the surface pad. Other embodiments are also described and claimed.

20 Claims, 14 Drawing Sheets

METHOD OF FABRICATING A CIRCUIT BOARD

CROSS REFERENCE TO RELATED APPLICATION

The present application claims priority to and is a divisional of co-owned, co-pending U.S. patent application Ser. No. 12/001,941 filed Dec. 13, 2007, the disclosure of which is incorporated herein by reference.

BACKGROUND

1. Field of the Invention

The present disclosure relates generally to circuit board signal/ground plane structures, and more particularly to impedance-tuning of a signal/ground plane structure that includes a surface pad.

2. Description of Related Art

Electronic assemblies commonly employ one or more printed circuit boards in their construction. Such circuit boards provide mounting points for electronic components and/or for sockets that allow other circuit boards, cables, or device packages to connect to the circuit board. The surface layers of the board include through-hole pads, surface mounting pads, and in many cases some conductive traces, known as microstrip when referenced to an underlying ground plane, that route signals between pads. The internal circuit board layers provide conductive traces, and possibly planar conductive regions, patterned on conductive layers sandwiched between insulating dielectric layers. A typical circuit board may contain anywhere from a few conductive layers to upwards of thirty such layers for complex systems. Conductive traces route signals (and possibly power) from one point on the circuit board to another point on the circuit board. Planar conductive regions are employed for power distribution. Planar conductive regions also serve as reference planes, which when coupled through a dielectric layer to one of the conductive traces or a differential pair of such traces, form stripline transmission lines of specific impedance. Plated through-holes (PTHs) in the circuit board can form mounting points for press-fit devices, allow for signal insertion/extraction to the internal board layers, and can also serve as layer-swapping vias that transfer a signal from a trace on one conductive layer to another trace on another conductive layer.

FIG. 1 contains a perspective view of a partial circuit board assembly 100, illustrating a few features helpful to the understanding of the embodiments described herein. Assembly 100 includes a surface conductive signal layer, and alternating conductive ground planes and conductive signal layers G1, S2, G2, S3, G3, S4, and G4, located within the circuit board, each conductive layer separated from its immediate neighbors by dielectric layers (for clarity, in FIG. 1 the internal conductive layers are indicated only by their positions on the facing edges of the cross-section). On the surface signal layer, end sections of a surface microstrip differential trace pair (D1+, D1−), terminate respectively at two surface primary pads (PP+, PP−). Each primary pad is proximate two configuration option pads, XFP+ and SFP+ for PP+, and XFP− and SFP− for PP−, where in this example "SFP" corresponds to a configuration option for "Small Form-Factor Pluggable" optical transceivers and "XFP" corresponds to a configuration option for "10 Gigabit Small Form-Factor Pluggable" optical transceivers. The + and − XFP pads connect respectively to two PTHs, PTH1+ and PTH1−, which couple the pads to other traces on signal layer S4, interior to the circuit board, that route the signals to an intended XFP destination. The + and − SFP pads connect respectively to two PTHs, PTH2+ and PTH2−, which couple the pads to other traces on signal layer S4 that route the signals to an intended SFP destination.

To configure the circuit board for a desired configuration option, two discrete packages, DP1 and DP2, are mounted between the primary pads and either the SFP or the XFP pads. In FIG. 1, DP1 connects PP+ to SFP+ and DP2 connects PP− to SFP−, configuring the circuit board for SFP operation. To configure the circuit board for XFP operation, DP1 and DP2 are rotated 90 degrees to couple to the XFP pads instead. DP1 and DP2 can contain jumpers, fuses, resistors, DC blocking capacitors, or other discrete components.

The size of each surface pad is determined by the size of the discrete package, mounting tolerances, and the necessity for flow solder bonding regions on the pad at each end of the package. Generally, these requirements dictate a pad that is much larger than the microstrip traces that deliver signals to or from the pad.

The single-ended characteristic impedance of a microstrip trace, for instance D1+, is determined by the coupling of the trace to ground plane G1. A significant factor in this characteristic impedance is the width of the conductor. As the width of each pad is significantly greater than the width of the conductor, a pad's capacitive coupling and characteristic impedance can depart considerably from the characteristic impedance of the trace connected to the pad, causing reflections and signal loss at high frequencies.

FIG. 2 depicts a plan view of a section 200 of circuit board 100, showing only the surface features D1+, PP+, XFP+, PTH1+, SFP+, and PTH2+, and the underlying features on ground plane G1 (shown in hidden lines). On ground plane G1, a through-hole clearance THC1+ allows PTH1+ to pass through the ground plane without shorting. A similar through-hole clearance THC2+ allows PTH2+ to pass through the ground plane without shorting. Three pad clearances, PC1, PC2, and PC3, adjust the impedance of the surface pads PP+, XFP+, and SFP+, respectively, by creating a large central opening in ground plane G1 where it underlies the surface pad.

BRIEF DESCRIPTION OF THE DRAWINGS

The present invention can be best understood by reading the specification with reference to the following Figures, in which.

DETAILED DESCRIPTION

Figure 1:
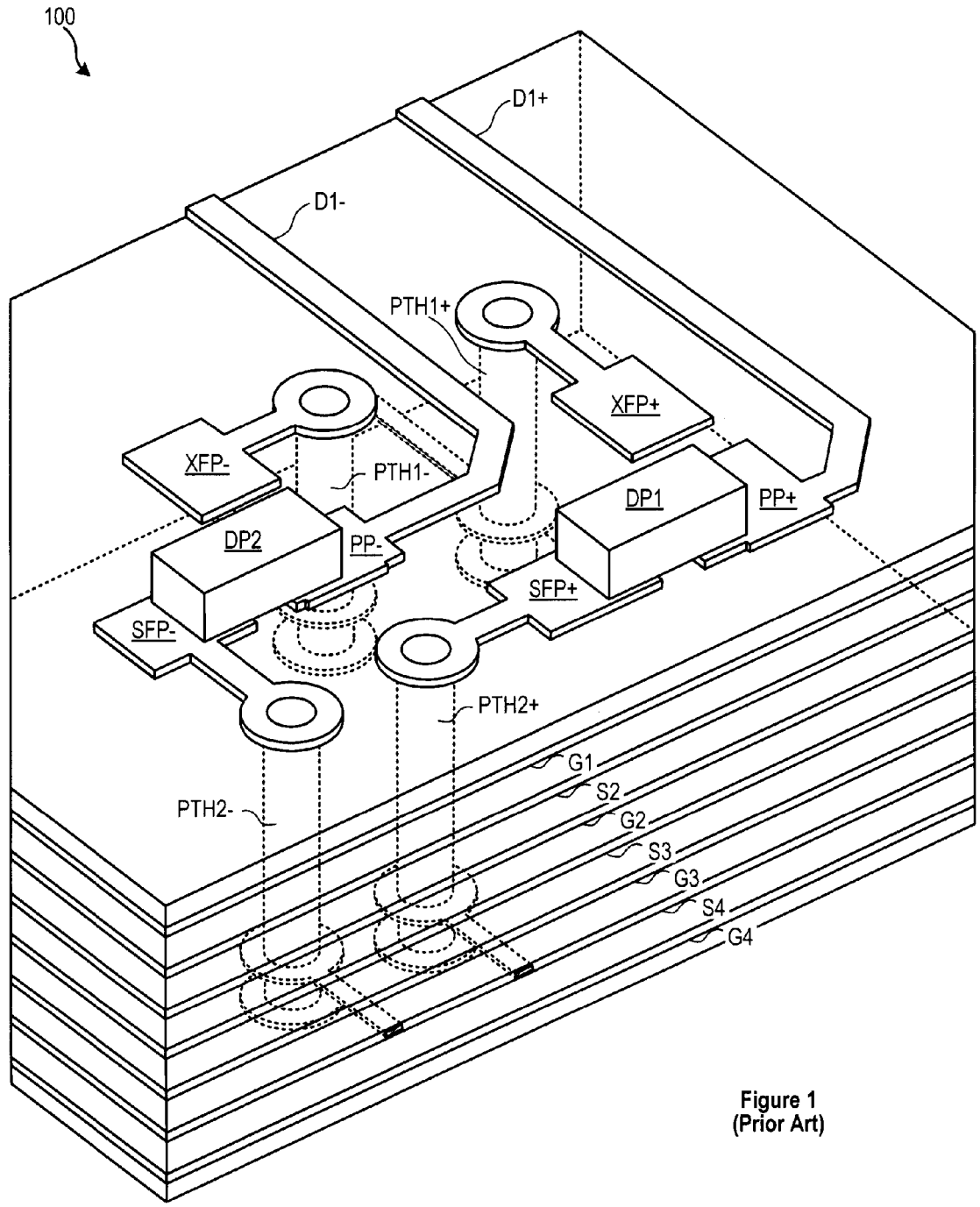
FIG. 1 contains a perspective view of a prior art partial circuit board assembly.
Figure 2:
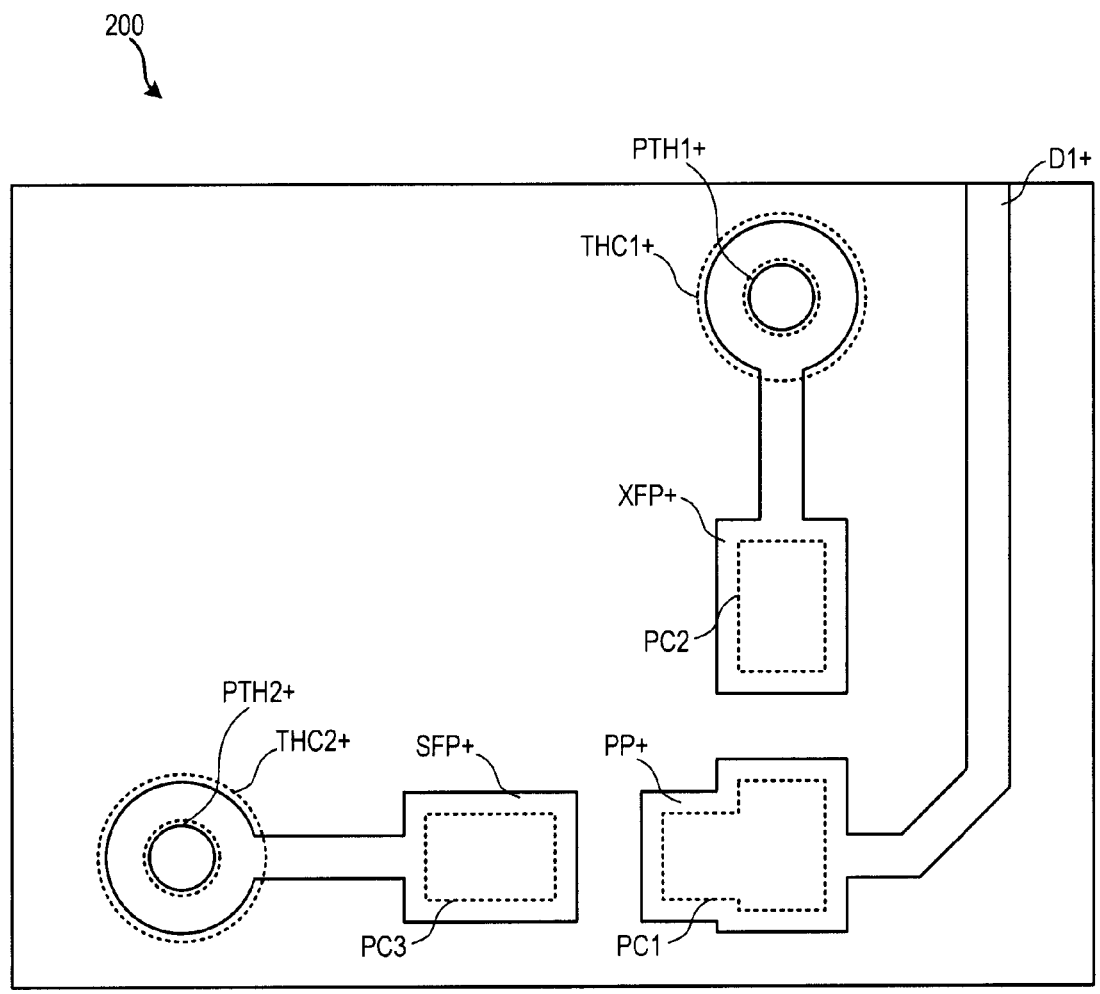
FIG. 2 contains a plan view of a prior art partial circuit board assembly, including some surface features from FIG. 1 and underlying ground plane features.

It has now been discovered that in many circumstances, the FIG. 2 approach to adjusting surface pad characteristic impedance is undesirable. The pad clearance is large enough to present both noise difficulties (noise coupling from below the ground plane to the surface pad) and routing difficulties, as any trace routed under the pad clearance in the ground plane not only loses its ground reference as it passes under the extended clearance, but also couples undesirably with the pad signals. The present embodiments disclose new approaches to adjusting surface pad characteristic impedance that allow a smaller clearance in the underlying ground plane, reduce crosstalk, and/or allow ground plane features that allow signals to be routed under the surface pad.

Figure 3A:
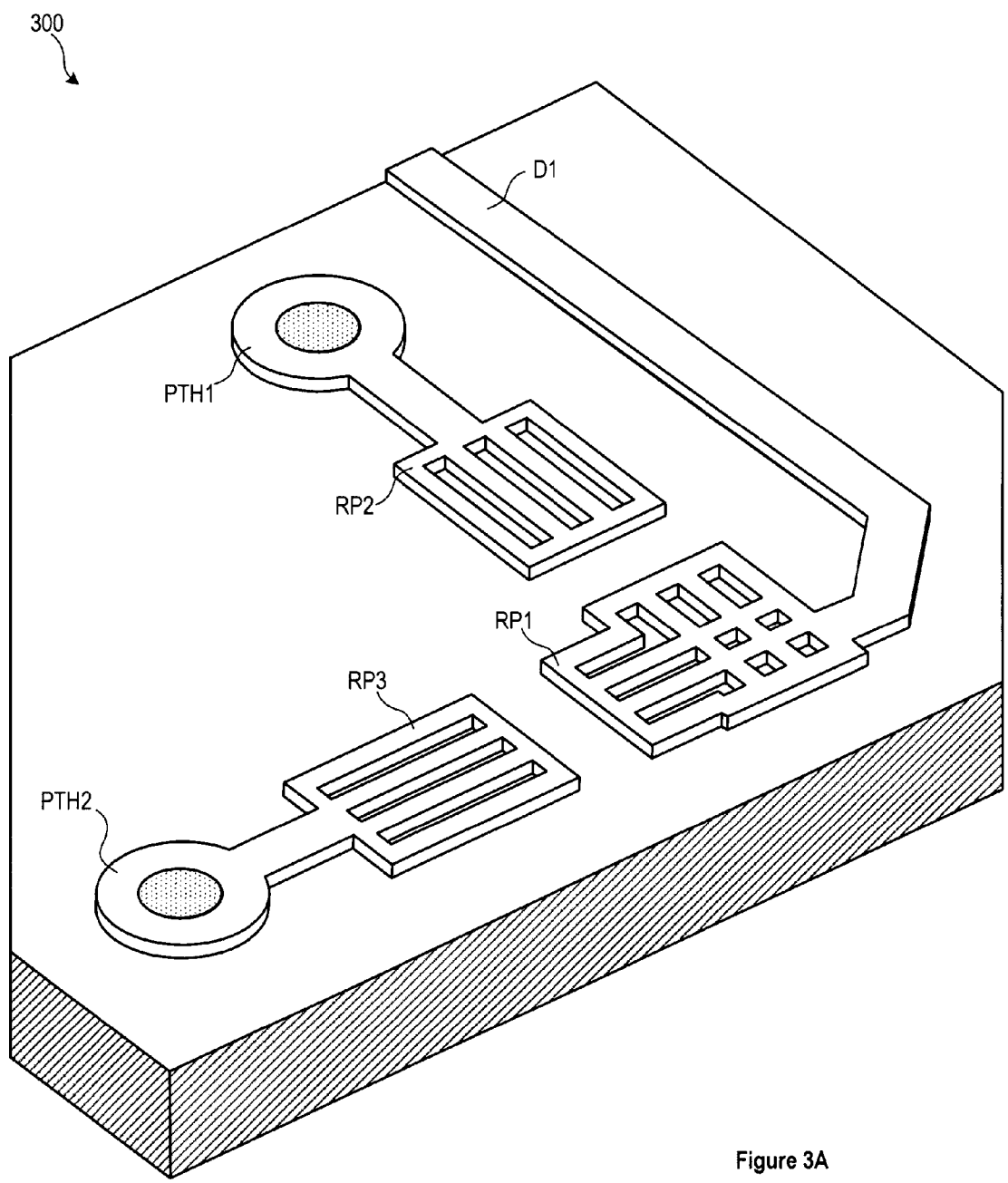
FIGS. 3A-F show, from a perspective view of a partial circuit board assembly, steps in the manufacture and use of configuration option pads according to an embodiment.

In some embodiments, the pad impedance is reduced by patterning internal features into the pad. One such embodiment is illustrated in FIGS. 3A-F, for a set of configuration option pads. FIG. 3A shows a configuration option pad set 300 after the surface conductive layer has been patterned. A conductive trace D1, plated through holes PTH1 and PTH2, and three reticulated pads RP1, RP2, and RP3 are shown. The reticulated pads take the same exterior shape and dimensions as the solid prior art pads, but have interior linear features where the conductive material has been removed. In the preferred embodiments, up to roughly half of the pad surface area is removed in this manner.

Several considerations drive the preferred directionality of the linear features in the reticulated pads. First, the remaining pad structure should effectively move current from an attached conductive trace to the location where the discrete package will electrically connect to the pad, without the current following a circuitous path. Second, the remaining pad structure should allow bonding via reflow soldering—the linear features are believed to aid in establishing a proper reflow of the solder paste from the mounted component. Because pad RP1 can accept a discrete component in two different orthogonal positions, the linear features consist of intersecting orthogonal features, forming a gridded layout on the reticulated pad.

Figure 3B:
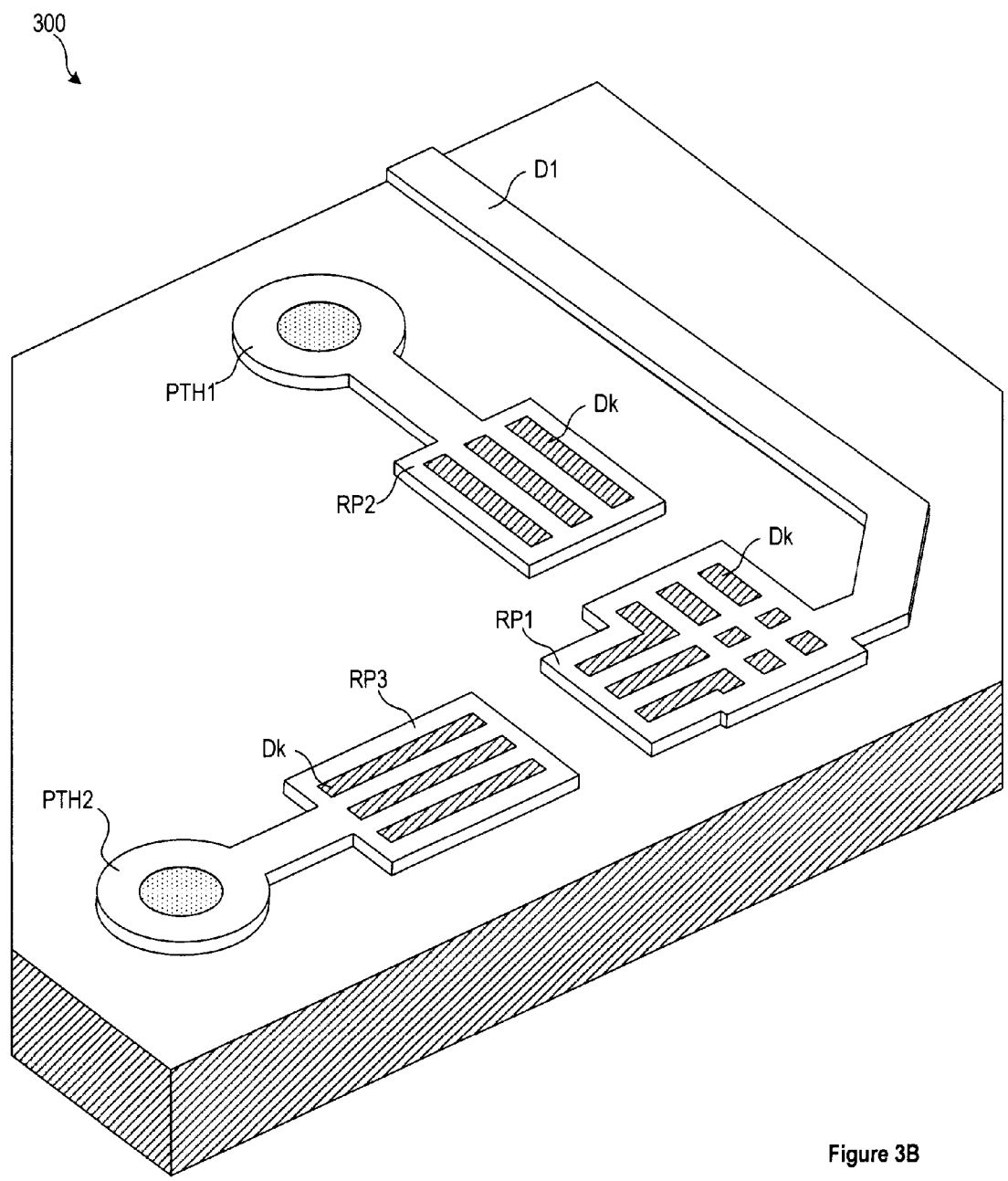

In FIG. 3B, the gaps in the reticulated surface pads RP1, RP2, and RP3 are filled with a dielectric material Dk. The dielectric material can be, e.g., a recured epoxy resin or a solder mask material. It is preferable that the dielectric material have a low dielectric constant and/or high loss factor at GHz frequencies to reduce coupling of signals from a component mounted over the material into the circuit board. The material preferably fills the gaps flush with the top surfaces of the pads, or slightly below.

Figure 3C:
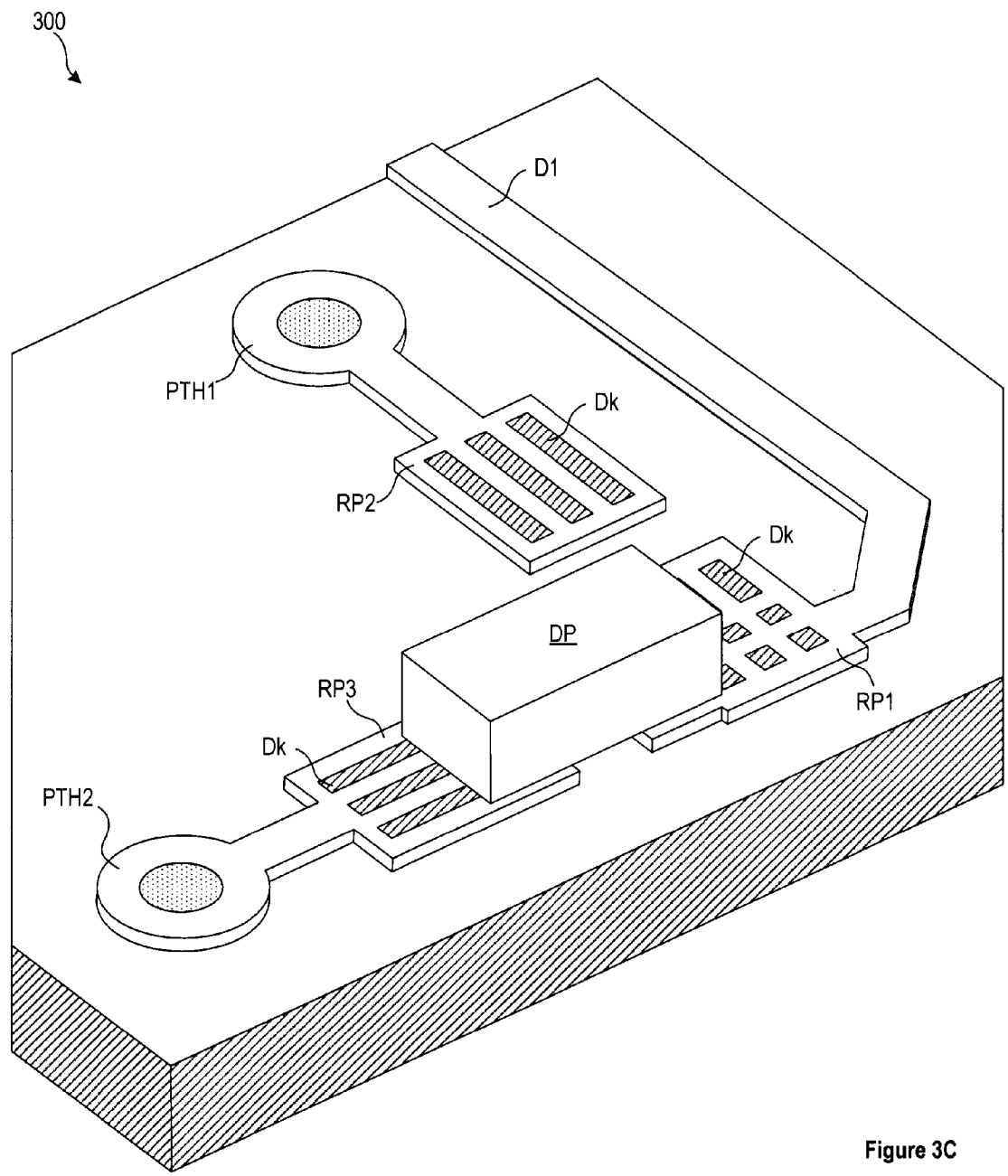

Referring now to FIG. 3C, a discrete package DP is placed in a bridging configuration across RP1 and RP3, with a small amount of solder paste (not visible) between each end of DP and the underlying pad. The solder paste temporarily holds the discrete package in place. Other components, packages, and integrated circuits (not shown) can be similarly adhered to desired positions on the circuit board at this point.

Figure 3D:
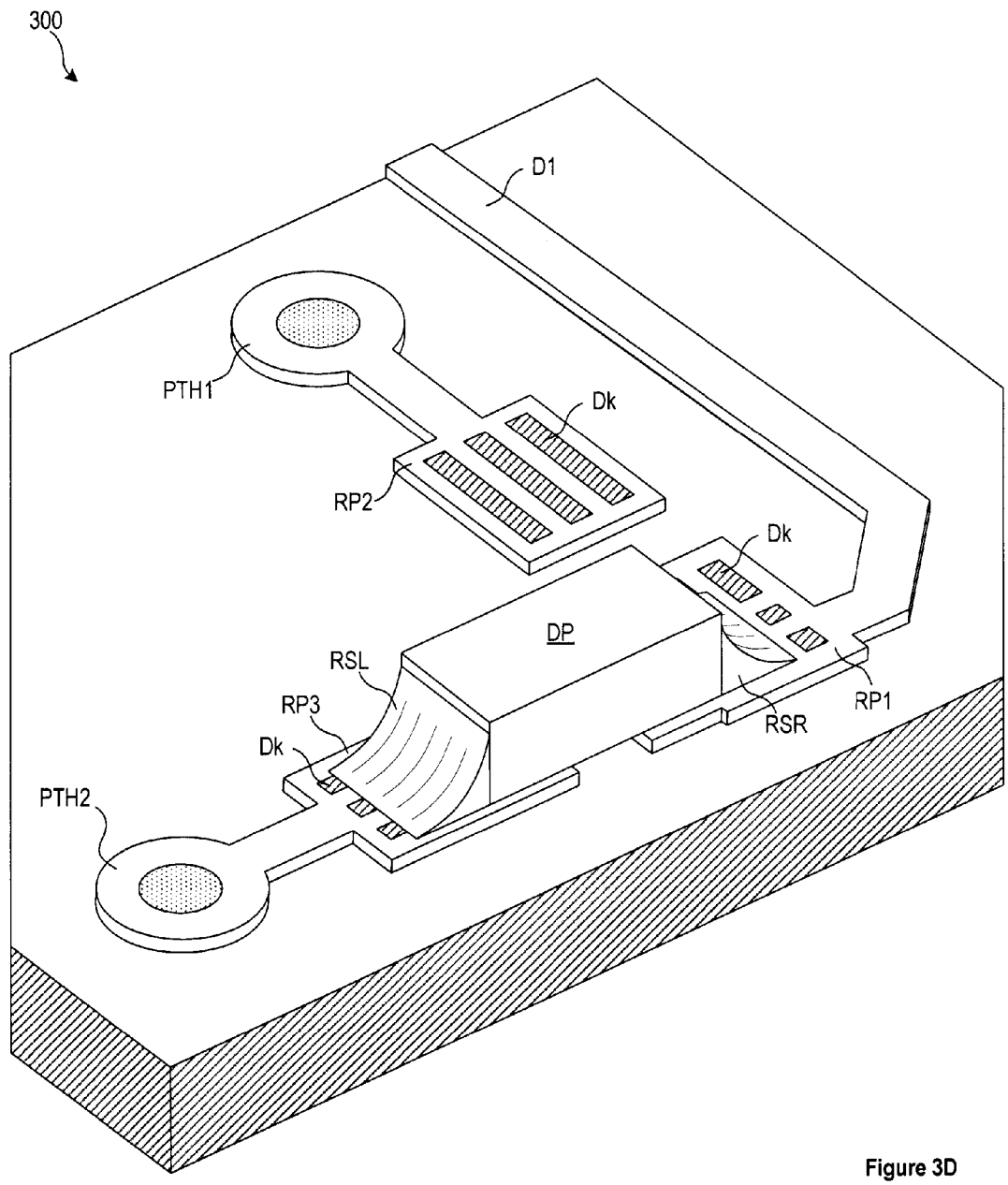
Figure 3E:
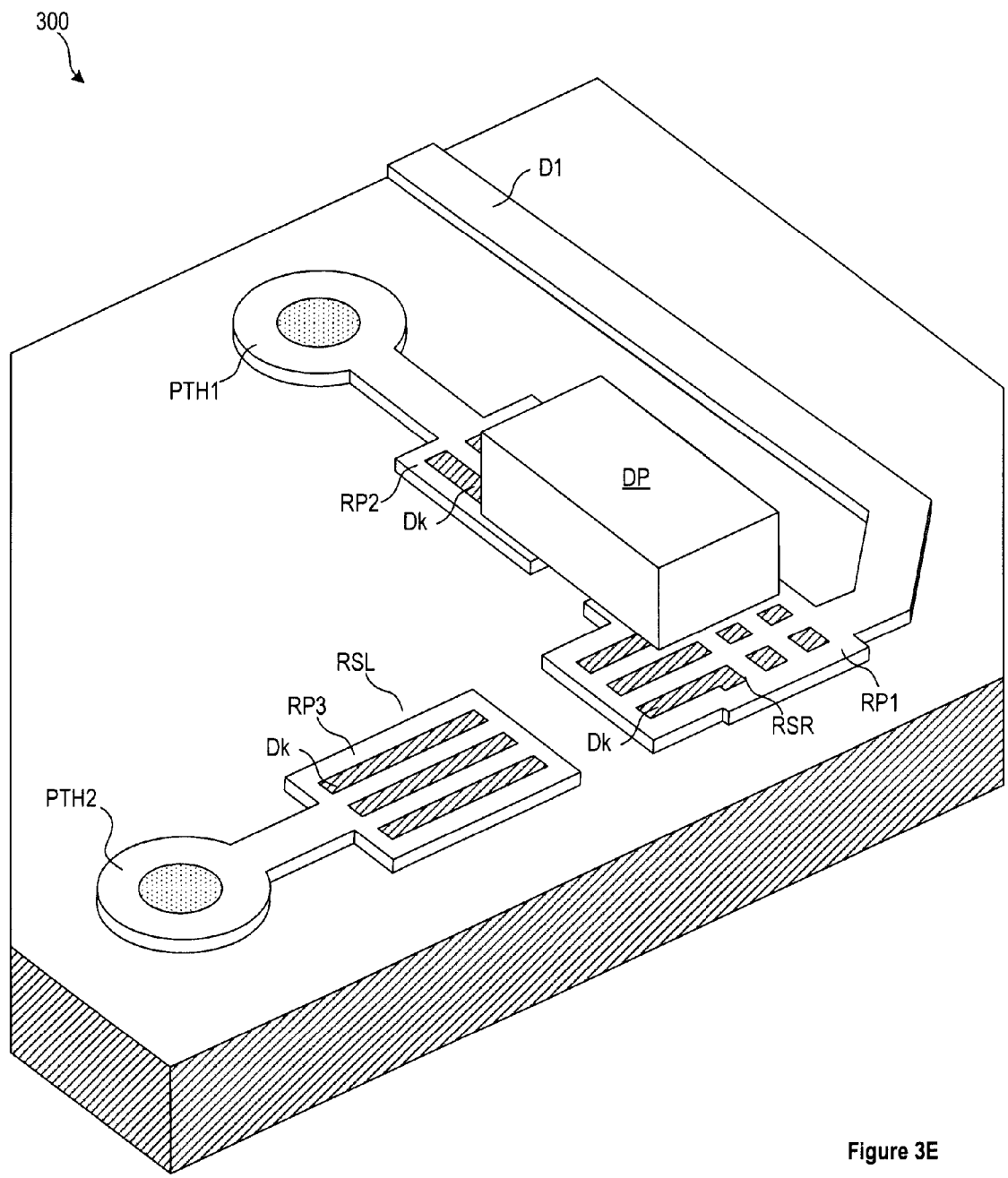

Discrete package DP is reflow soldered by subjecting the circuit board to a controlled temperature profile that liquefies the solder paste and causes it to flow and bond the discrete package to the reticulated pads RP1 and RP3. In FIG. 3D, solder RSL flows along the linear structures of RP3 to form the approximate profile shown bonding the left end of DP to RP3. Solder RSR flows along the left-to-right linear structures of RP1 to form the approximate profile shown bonding the right end of DP to RP1.

Figure 3F:
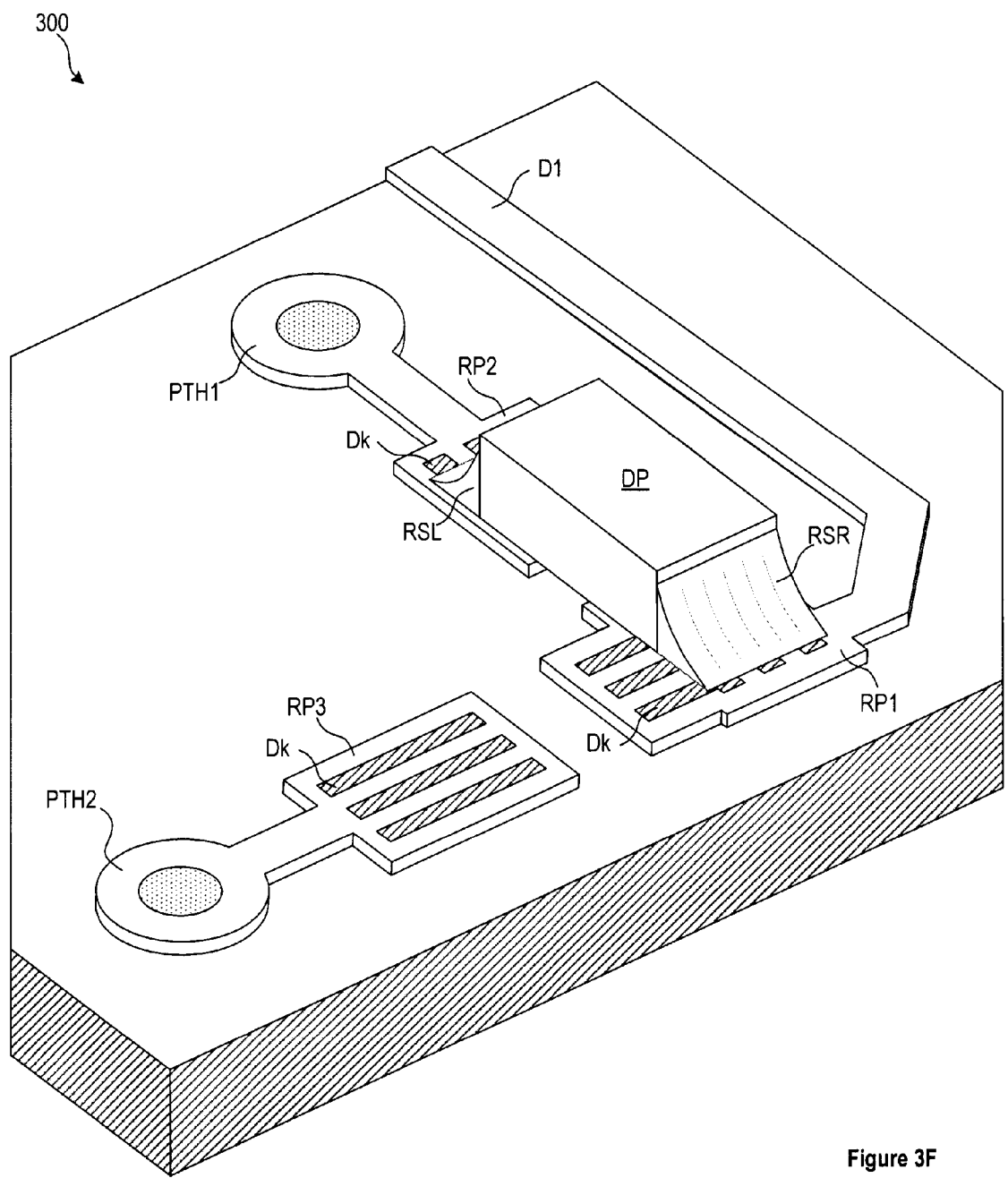

In the second configuration option, the discrete package DP is placed across RP1 and RP2 (see FIG. 3E), with solder paste temporarily holding the discrete package in place. A reflow solder process then bonds DP to RP1 and RP2. In FIG. 3F, solder RSL flows along the linear structures of RP2 to form the approximate profile shown bonding the left end of DP to RP2. Solder RSR flows along the top-to-bottom linear structures of RP1 to form the approximate profile shown bonding the right end of DP to RP1.

Two primary effects serve to decrease the capacitance of the active reticulated pad structures. First, in areas of an active pad that do not contain solder and consist of a reticulated opening, the effective area of the pad is decreased. Second, in areas of an active pad that consist of a reticulated opening with overlying solder, the conductive "plate" of the capacitor has been elevated (and preferably placed against a low-performance dielectric), increasing the effective distance between the solder and any underlying conductive structures.

Figure 4:
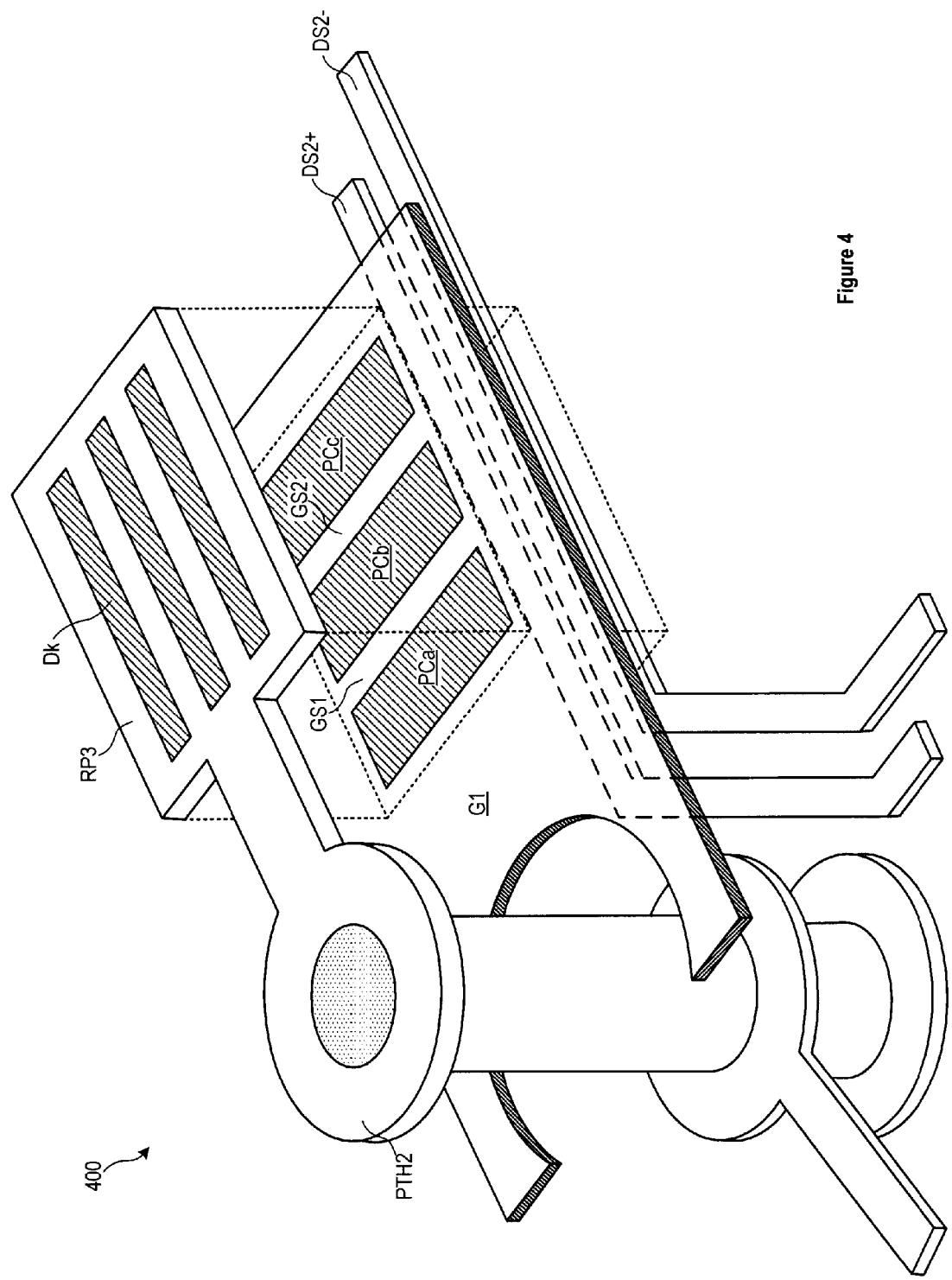
FIGS. 4 and 5 show, from a perspective view of a partial circuit board assembly, other embodiments including the routing of signal traces on a trace layer under the ground plane layer referenced to the surface layer.

FIG. 4 shows, in perspective, an assembly 400 of circuit board components, with the vertical spacing between the layers accentuated for visibility. Assembly 400 includes reticulated pad RP3 on a surface layer (the inter-layer dielectric material under the surface pad has been removed for clarity), connected to plated through-hole PTH2. The footprint of pad RP3 is shown projected down onto underlying ground plane layer G1, where three rectangular openings PCa, PCb, and PCc in G1 are spaced across the central area underlying pad RP3. The three openings are separated by two conductive spokes GS1 and GS2, oriented orthogonal to the linear features of pad RP3. The size of the openings and width of the spokes can be varied to adjust the impedance of the reticulated pad.

FIG. 4 also shows one differential pair routing path through the region underlying the openings PCa, PCb, and PCc. A differential pair DS2+, DS2− is illustrated at the trace layer routed directly under G1 (separated by a dielectric layer, omitted for clarity). Each conductor is vertically aligned with one of the dielectric-filled openings in the surface pad RP3. This reduces crosstalk from the pad RP3 to the differential pair and vice versa.

Figure 5:
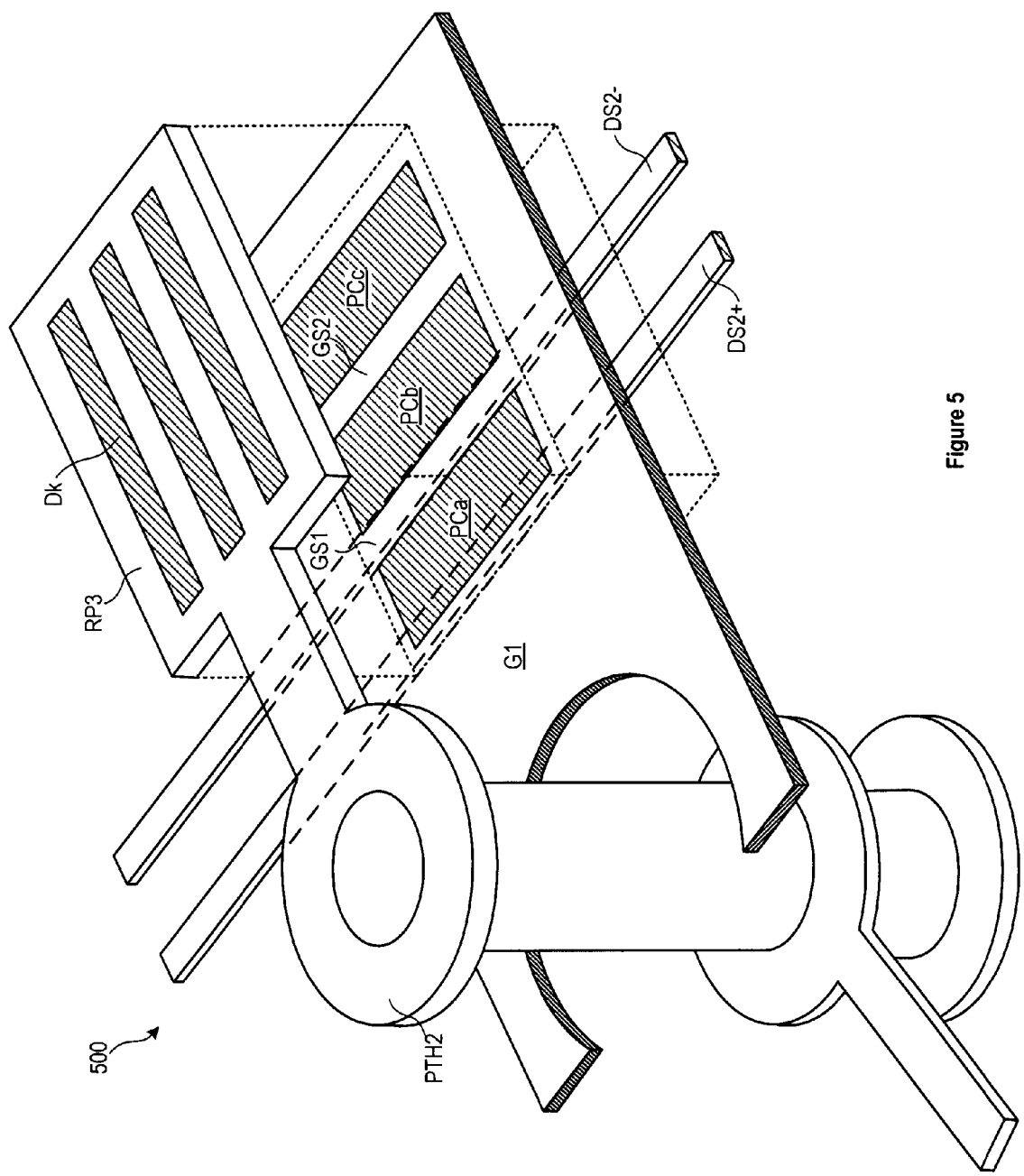

FIG. 5 illustrates an assembly 500 that is in all respects except for the routing of DS2+ and DS2− identical to assembly 400. In assembly 500, DS2+ and DS2− have been rotated 90 degrees in-plane, but still route below the surface pad RP3. To preserve the characteristic impedance of the differential pair in the region under surface pad RP3, each trace is vertically aligned with one of the ground plane spokes GS1, GS2. The spokes thus maintain a reference for the differential pair and shield the pair from the overlying surface pad.

Figure 6A:
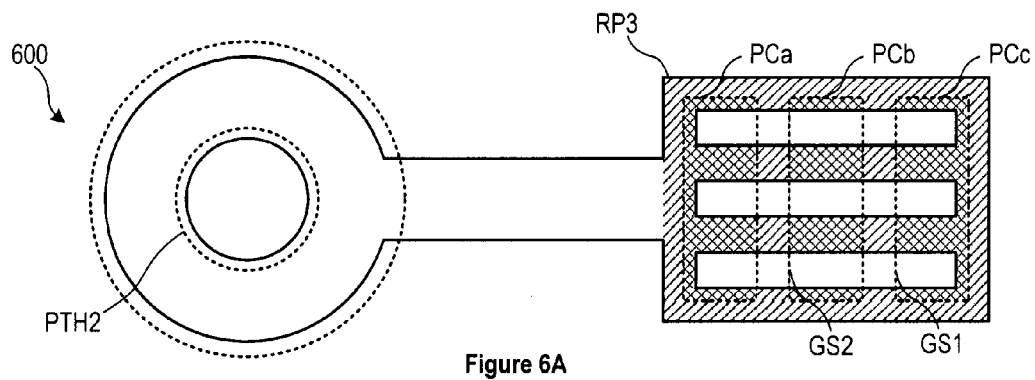
FIGS. 6A-6C depict embodiments of a surface pad structure and underlying ground structure, showing the alignment of signal routing channels for the top embedded signal layer.

FIG. 6A contains a plan view of the top two layers of FIGS. 4 and 5, showing the surface pad RP3 in solid lines and the ground plane pad clearances PCa, PCb, and PCc in hidden lines (the PTH clearance is also shown in hidden lines). As can be seen in this view, in the center portion of the pad, only the double-hatched regions are open from a conductive area of pad RP3 through the ground plane. Also, only the single-hatched regions contribute capacitance between the pad and the ground plane.

Figure 6B:
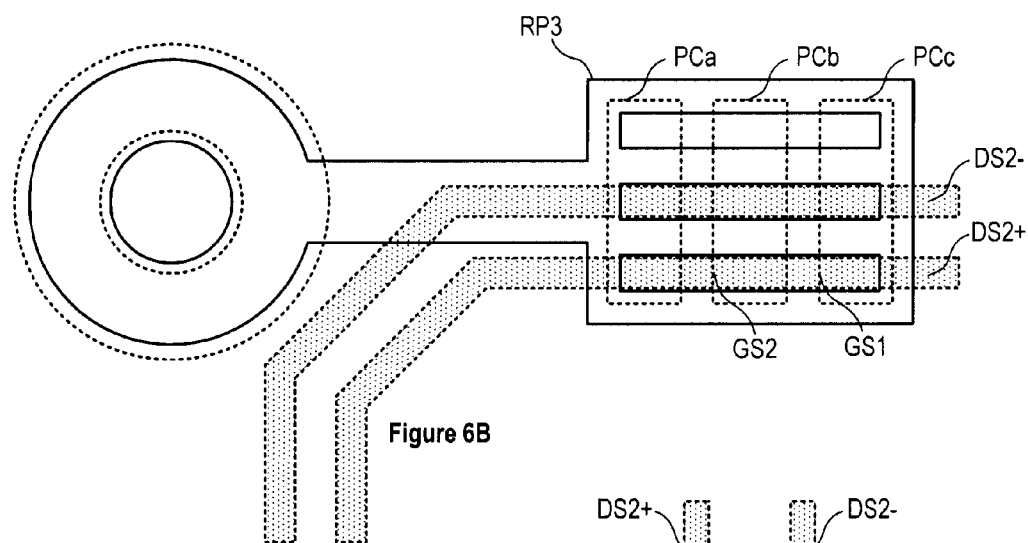

FIG. 6B contains a plan view of all three layers of FIG. 4, with the lower signal layer trace pair DS2+ and DS2− shown in hidden lines and shaded. FIG. 6B shows one preferred routing alignment under pad RP3 and the ground plane clearances for a differential pair. As can be seen, each conductor of the pair is aligned under with one of the linear openings in the pad RP3.

Figure 6C:
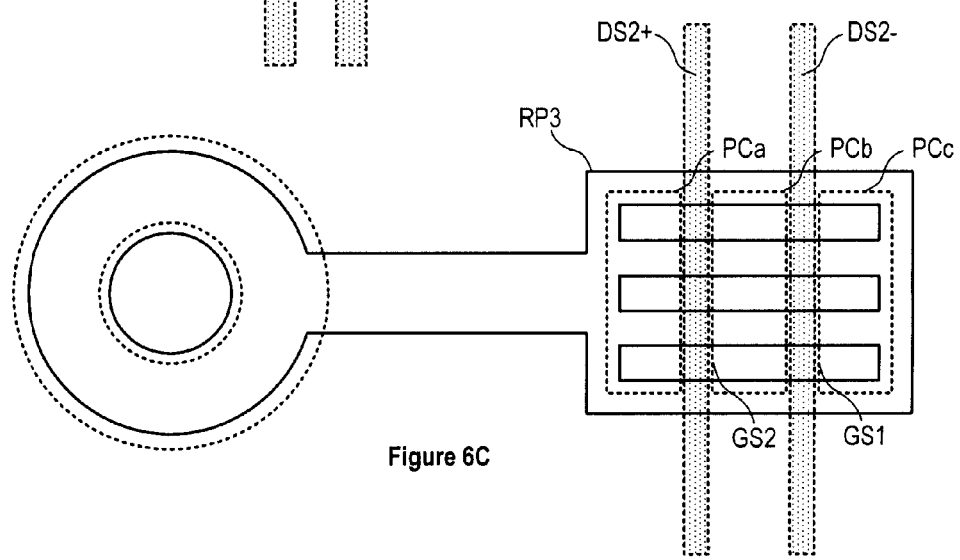

FIG. 6C contains a plan view of all three layers of FIG. 5, with the lower signal layer trace pair DS2+ and DS2− shown in hidden lines and shaded. FIG. 6C shows the preferred routing alignment for a differential pair crossing pad RP3 side to side. As can be seen, each conductor of the pair is aligned under one of the ground plane spokes GS1, GS2.

In the prior art, no attempt was made to add an inductive component to the coupling between a surface pad and a ground plane. It has now been discovered that an inductive component can be added to the ground plane under a surface pad and controlled to allow significant narrowing of the openings that are made in the ground plane under or near the pad. In the following embodiments, a large central reference pad on the ground plane under a surface pad connects to the remainder of the ground plane by one or more conductive spokes. A variety of possible conductive reference pad/spoke arrangements are presented herein, including those that attenuate the transmission of high-frequency noise from the ground plane to the reference pad (and therefore to the surface pad). By incorporating such features in a ground plane adjacent to a layer containing surface pads on a circuit board, the circuit board can be made to damp the coupling of undesirable high-frequency signals/noise from the ground plane to a surface pad and vice versa.

Figure 7:
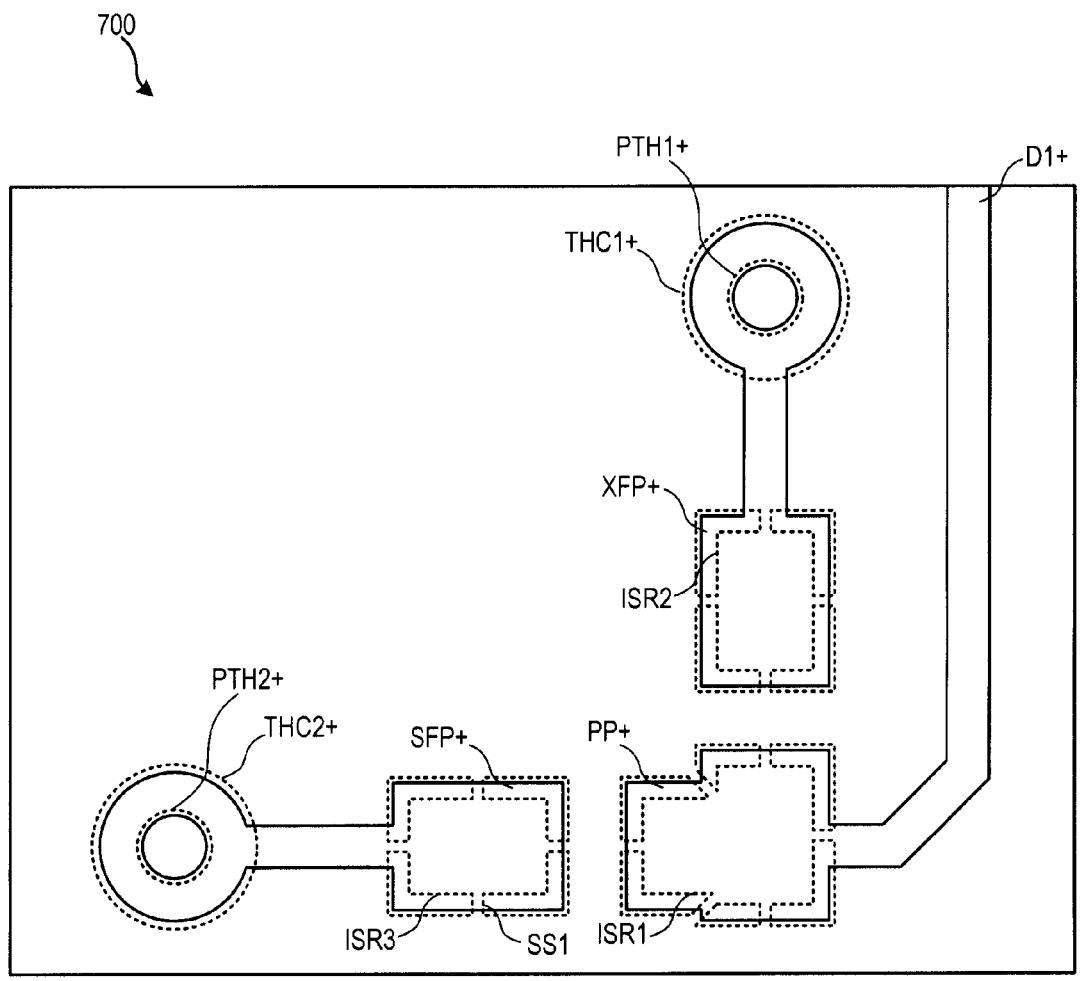
FIG. 7 contains a plan view of a partial circuit board assembly, including a configuration option assembly and underlying ground structure according to an embodiment.

FIG. 7 illustrates, in plan view, a partial circuit board assembly 700 according to an embodiment. Partial circuit board assembly 700 includes the same surface features as the assembly 200 of FIG. 2, including a trace D1+, three configuration option pads PP+, XFP+, and SFP+, and two through holes PTH1+ and PTH2+.

The features present on the ground plane under this structure are illustrated in hidden lines. These features include two through-hole clearances THC1+ and THC2+, co-located with the position of the plated through-holes. The large pad clearances of the prior art have been replaced, however, with inductive spoke reference pads ISR1, ISR2 and ISR3. Each of these reference pads is separated from the primary expanse of the ground plane by smaller clearances. A series of spokes (see, e.g., spoke SS1 connected to reference pad ISR3) connect each reference pad to the adjacent regions of the ground plane.

In operation, the capacitance between the reference pad and the overlying surface pad is considerable, compared to the capacitance of the large pad clearance of FIG. 2. Consequently, at low frequency, the impedance of the surface pad does not match the impedance of the trace well, but effectively shields the surface pad and any traces running under the reference pad from each other. At GHz frequencies, however, the inductive impedance of the spokes begins to significantly affect the ability of the reference pad to couple signals from the surface pad to the ground plane. In other words, the reference pad cannot be quickly charged and discharged in response to potential changes in the surface pad, as the serial-path inductive spokes deter rapid changes in the rate of charge and discharge of the reference pad. This raises the overall characteristic impedance of the pad to an acceptable level through the primary signaling frequencies.

The number, width, and length of the spokes, and size of the reference pad, can be varied to achieve different impedance characteristics. One approach to selecting a proper configuration for a given application involves building a test board with trace and pad geometries, dielectric material and material thickness, etc., set to those that will be used in the application. Different test paths are fabricated similar to each other, but with different ground plane reference pad geometries. Each path is then tested to determine the one delivering the most desirable impedance vs. frequency characteristics.

Due to the small clearances between the reference pad and the adjacent portions of the ground plane, trace routing through the region under the surface pad is now easier. In general, traces can be routed freely under a ground pad such as ISR3. Alternately, routing paths can be designated under the inductive spokes, as shown in the reference pad/spoke embodiments of FIGS. 8A-8D.

Figure 8A:
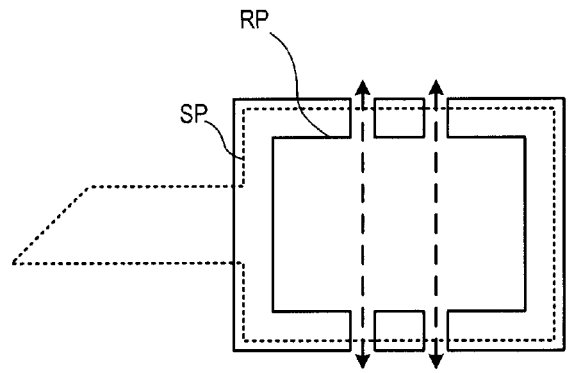
FIGS. 8A-D show alternate ground structure embodiments with signal routing channels for an underlying embedded signal layer.

In each of FIGS. 8A-8D, a plan view of a surface pad SP is shown in hidden lines, and the clearance between a ground plane and the reference pad RP, as well as the connecting spokes, are shown in solid lines. In FIG. 8A, paired spokes connect the reference pad RP to the ground plane across the short dimension of the pad, with each pair arranged at the appropriate spacing for an underlying differential pair. This forms a differential pair routing path that crosses the region under the surface pad SP and reference pad RP by passing under and in alignment with the spokes. With the spokes set to approximately 110% of the trace width, the traces are essentially shielded from interference from the surface pad, and properly reference the ground plane. Alternately, the spokes can be narrower than the traces if needed to impart the appropriate inductance to the reference pad/ground plane coupling, while still at least partially shielding the differential pair.

Figure 8B:
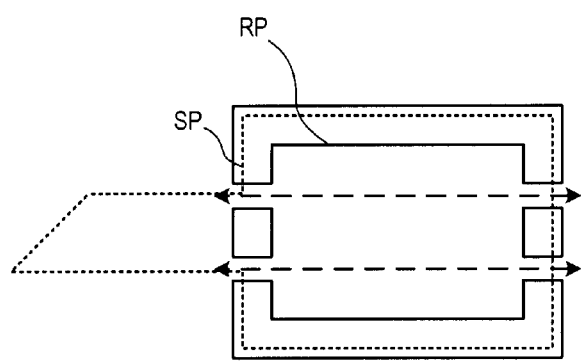
Figure 8C:
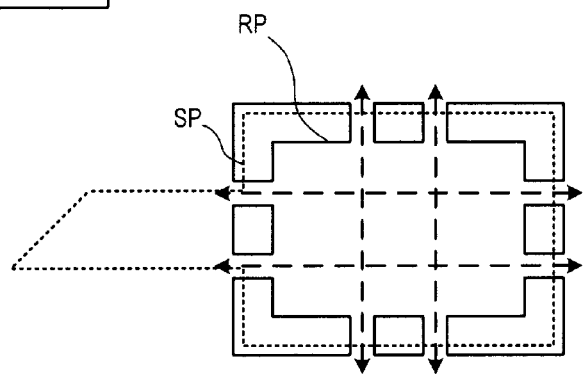

In FIG. 8B, paired spokes connect the reference pad RP to the ground plane across the long dimension of the pad, with each pair arranged at the appropriate spacing for an underlying differential pair, forming a differential pair routing path orthogonal to the path of FIG. 8A. In FIG. 8C, the reference pad RP is connected to the ground plane using the spokes of both FIG. 8A and FIG. 8B, allowing differential pair routing through the region in either direction.

In one embodiment, the spoke arrangement is dependent on the alignment of a differential pair passing under the pads. The spokes can be shifted side to side or angled as necessary to shield the differential pair.

Figure 8D:
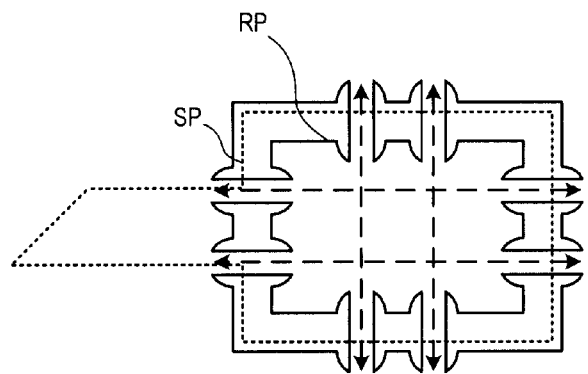

It is possible that the spoke width and number desired to shield one or more underlying differential pairs do not provide the desired inductance. In such a case, the spokes can be lengthened, e.g., as shown in FIG. 8D. In FIG. 8D, notches are created in the reference pad RP and in the adjacent portions of the ground plane, effectively lengthening the span of each spoke and increasing its inductive effect at high frequency. The notches are small enough to not significantly affect the size and shielding capability of the reference pad.

Figure 9:
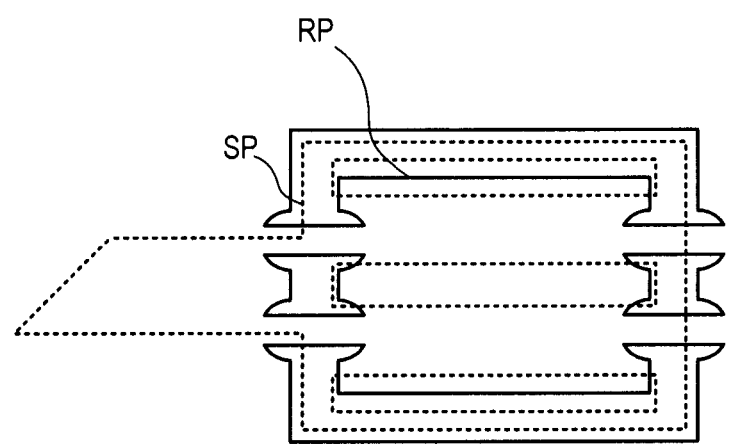
FIG. 9 shows a surface pad/reference pad embodiment.

When desired, a reticulated surface pad can be combined with an inductively-coupled ground reference pad in a shared configuration. FIG. 9 illustrates such a configuration. Surface pad SP is reticulated, with three dielectric-filled openings. Reference pad RP connects through spokes to the adjacent portions of the underlying ground plane. The reference plane shields the surface pad and underlying board structure from each other. The spokes provide a routing path for a differential pair, and high-frequency impedance compensation. The dielectric-filled openings in the surface pad SP reduce the capacitance of the surface pad.

Those skilled in the art will appreciate that the embodiments and/or various features of the embodiments can be combined in other ways than those described. A small number of exemplary pad and pad/spoke arrangements are shown. The dimensions of these can be varied to achieve a desired effect, or other pad and pad/spoke arrangements can be made using the principles described herein. Single-ended signals as well as differential signals can be routed under pads, or on signals that pass through pads. The embodiments are applicable to surface pads other than configuration option pads, which are intended to serve as an exemplary application. The pad layouts, number of ground and signal layers portrayed, etc., are merely exemplary, and will vary by application.

Although the specification may refer to "an", "one", "another", or "some" embodiment(s) in several locations, this does not necessarily mean that each such reference is to the same embodiment(s), or that the feature only applies to a single embodiment.

What is claimed is:

1. A method of fabricating a circuit board, comprising:
patterning a surface pad on a surface conductive layer;
patterning at least one clearance in a conductive reference plane layer, the at least one clearance creating a reference pad, the reference pad connected to adjacent portions of the conductive reference plane layer by at least one conductive spoke adjacent the at least one clearance;
patterning a differential trace pair in an embedded conductive signal layer;
joining the surface conductive layer and the conductive reference plane layer to opposite sides of a first dielectric layer such that the reference plane layer underlies the first surface pad; and
joining the embedded conductive signal layer and the conductive reference plane layer to opposite sides of a second dielectric layer such that the differential trace pair passes under the first reference pad.

2. The method of claim 1, further comprising:
forming a reticulation pattern in the surface pad.

3. The method of claim 2, further comprising:
at least partially filling the reticulation pattern with a dielectric material.

4. The method of claim 1, further comprising:
patterning a trace on the surface conductive layer; and
positioning a spoke of the at least one conductive spoke and the trace in relative alignment.

5. The method of claim 1, further comprising:
the at least one clearance creating the reference pad connected to adjacent portions of the conductive reference plane layer by a first pair of conductive spokes oriented such that a first of the first pair of the conductive spokes overlies a first of the differential trace pair and a second of the first pair of the conductive spokes overlies a second of the different trace pair.

6. The method of claim 5, further comprising:
the at least one clearance creating the reference pad connected to adjacent portions of the conductive reference plane layer by a second pair of conductive spokes oriented such that a first of the second pair of the conductive spokes overlies a first of the differential trace pair and a second of the second pair of the conductive spokes overlies a second of the different trace pair.

7. The method of claim 5, further comprising:
wherein each of the first pair of conductive spokes includes an average width of at least 110% of the width of the different trace pair traces.

8. The method of claim 1, wherein the patterning at least one clearance in the conductive reference plane layer includes providing a notch in at least one of the first reference pad or a portion of the reference plane layer that is adjacent the first reference pad and routing the at least one conductive spoke into the notch to connect the first reference pad to the portion of the reference plane layer that is adjacent the first reference pad.

9. The method of claim 1, wherein the patterning the surface pad on the surface conductive layer includes providing an interior reticulated pattern in which a conductive material of the surface conductive layer is absent.

10. The method of claim 9, further comprising:
filling the interior reticulated pattern with a dielectric material.

11. The method of claim 10, wherein the providing the interior reticulated pattern includes orienting the interior reticulated pattern such that the interior reticulated pattern is aligned with a component when the component is coupled to the first surface pad.

12. The method of claim 11, further comprising:
mounting a component to the first surface pad such that the component is aligned with the interior reticulated pattern.

13. The method of claim 11, wherein the component includes two possible alignments, and wherein the interior reticulated pattern includes the intersection of two reticulation patterns that correspond respectively to the two possible alignments.

14. The method of claim 1, further comprising:
patterning a plurality of proximate surface pads, wherein the first surface pad is one of the plurality of proximate surface pads, and wherein each of the plurality of proximate surface pads is aligned with a corresponding proximate reference pad patterned in the conductive reference plane layer and including at least one conductive spoke;
configuring a circuit board by attaching a component between a first proximate surface pad and a second proximate surface pad.

15. A method of setting an impedance characteristic of a surface pad on a circuit board, the method comprising:
positioning a conductive reference pad under the surface pad, the conductive reference pad located on a first plane layer that is separated from the surface pad by a first dielectric layer;
inductively coupling the conductive reference pad to a ground reference; and
positioning a differential trace pair under the conductive reference pad, the differential trace pair located on a second plane layer separated from the conductive reference pad by a second dielectric layer.

16. The method of claim 15, further comprising:
patterning at least one opening in an interior portion of the surface pad, wherein the patterning the at least one opening reduces the capacitive coupling of the surface pad to the conductive reference pad.

17. The method of claim 16, further comprising:
at least partially filling the at least one opening with a dielectric material.

18. The method of claim 15, further comprising:
connecting the surface pad to a microstrip conductor on a surface of the circuit board, wherein the microstrip conductor is referenced to the ground reference and includes a first characteristic impedance, and wherein in at least one frequency range less than 1 GHz a characteristic impedance of the surface pad is less than the first characteristic impedance, and in at least one frequency range greater than 1 GHz the characteristic impedance of the surface pad is equal to or greater than the first characteristic impedance.

19. The method of claim 15, further comprising:
coupling a component to the surface pad.

20. The method of claim 15, wherein the conductive reference pad is separated from adjacent portions of the first plane layer by at least one clearance and is connected to adjacent portions of the first plane layer by at least one conductive spoke.

* * * * *